(12) United States Patent
Hachinohe et al.

(10) Patent No.: US 8,385,569 B2
(45) Date of Patent: Feb. 26, 2013

(54) ACOUSTIC TRANSDUCER UNIT

(75) Inventors: Satoru Hachinohe, Higashiomi (JP);
Takahiro Oguchi, Yokohama (JP)

(73) Assignee: Murata Manufacturing Co., Ltd.,
Nagaokakyo-Shi, Kyoto-fu (JP)

( * ) Notice: Subject to any disclaimer, the term of this patent is extended or adjusted under 35 U.S.C. 154(b) by 541 days.

(21) Appl. No.: 12/557,911

(22) Filed: Sep. 11, 2009

(65) Prior Publication Data

US 2010/0067732 A1    Mar. 18, 2010

(30) Foreign Application Priority Data

Sep. 12, 2008    (JP) .................................. 2008-235280

(51) Int. Cl.
*H04R 5/02* (2006.01)

(52) U.S. Cl. ........ 381/189; 381/361; 381/365; 381/369; 381/355

(58) Field of Classification Search .......... 381/174–175, 381/355–357, 189, 361, 365, 369
See application file for complete search history.

(56) References Cited

U.S. PATENT DOCUMENTS

| | | | |
|---|---|---|---|
| 6,594,369 B1 * | 7/2003 | Une | 381/174 |
| 6,748,091 B2 * | 6/2004 | Hohjyo et al. | 381/174 |
| 6,781,231 B2 | 8/2004 | Minervini | |
| 7,537,964 B2 * | 5/2009 | Minervini | 438/113 |
| 2005/0002538 A1 * | 1/2005 | Yonehara et al. | 381/174 |
| 2005/0135648 A1 * | 6/2005 | Lee | 381/355 |
| 2008/0037815 A1 * | 2/2008 | Ito et al. | 381/355 |

* cited by examiner

*Primary Examiner* — Curtis Kuntz
*Assistant Examiner* — Ryan Robinson
(74) *Attorney, Agent, or Firm* — Dickstein Shapiro LLP

(57) ABSTRACT

An acoustic transducer unit includes a first member having a recess, and a plate-like second member having main surfaces. The second member is bonded to the first member so as to cover the recess and form a housing. A microphone element, which is an acoustic transducer, is accommodated in an internal space of the housing, and an acoustic path is provided between the internal space and an external space of the housing. A conductive electromagnetic-shielding member and terminal members for electrically connecting the microphone element and an external circuit are embedded in a resin body of the first member by insert molding. An electromagnetic shield layer of the second member is electrically connected to the electromagnetic-shielding member.

13 Claims, 17 Drawing Sheets

ACOUSTIC TRANSDUCER UNIT

BACKGROUND OF THE INVENTION

1. Field of the Invention

The present invention relates to acoustic transducer units and, more specifically, to acoustic transducer units accommodating acoustic transducer elements, such as microphones or speakers, in housings.

2. Description of the Related Art

The present invention relates to acoustic transducer units and, more specifically, to acoustic transducer units accommodating acoustic transducer elements, such as microphones or speakers, in housings.

When an electromagnetic shield is formed around elements in a structure in which the elements are arranged on a substrate and are covered with a cap member, for example, a structure according to a comparative example shown in a sectional view in FIG. 16 may be adopted. That is, a microphone element 2 is mounted on a multilayer substrate 30x having conductive layers 30y for electromagnetic sealing therein and is bonded thereto with wires 3. Then, a cap member 20x having a conductive layer 20y for electromagnetic sealing, which is formed by plating or the like, is bonded to the multilayer substrate 30x so as to cover the microphone element 2. An acoustic path 80 communicating between the outside of the housing and the microphone element 2 is formed inside the multilayer substrate 30x.

However, the structure of FIG. 16 has the following problems.

First, because the element is mounted face up, a wiring space is needed. Thus, it is impossible to reduce the size and height. Furthermore, because unnecessary volume is large, an acoustically optimum design is impossible.

Second, because the multilayer substrate and the cap member are made to have an electromagnetic shielding function, the structure of the multilayer substrate becomes complex and treatment for giving conductivity to the cap member, e.g., plating, is needed. These increase costs.

Third, because the acoustic path is formed in the multilayer substrate, the manufacturing method for the multilayer substrate is complex and difficult. This increases the cost of the substrate. Furthermore, seepage of adhesive into the acoustic path or deformation of the acoustic path occurring in the manufacturing process of the substrate causes variation in performance. This makes the manufacture troublesome and increases costs.

SUMMARY OF THE INVENTION

In view of the above-described circumstances, the present invention provides an acoustic transducer unit that can be easily reduced in size and height and can be manufactured at low cost.

To solve the above-described problems, the present invention provides an acoustic transducer unit having a structure described below.

An acoustic transducer unit includes (a) a first member having a recess, (b) a plate-like second member having main surfaces, the second member being bonded to the first member so as to cover the recess, the first and second members forming a housing, (c) an acoustic transducer accommodated in an internal space of the housing, and (d) an acoustic path communicating between the internal space and an external space of the housing. The first member includes (i) a body defining the recess, (ii) an electromagnetic-shielding member disposed inside the body and having conductivity, and (iii) a terminal member having an internal terminal portion that extends in the internal space of the body and is electrically connected to the acoustic transducer, an external terminal portion that extends in the external space, and a connecting portion connecting the internal terminal portion and the external terminal portion. The second member has conductivity and is electrically connected to the electromagnetic-shielding member.

This structure minimizes the size of the internal space for accommodating the acoustic transducer, making it possible to easily reduce the size and height of the acoustic transducer unit. Furthermore, by fabricating the first member having the electromagnetic-shielding member and the terminal member embedded in the body by, for example, insert molding, the manufacturing cost can be reduced compared to a case where a multilayer substrate having a complex structure is used.

It is preferable that the internal terminal portion extend along the bottom surface of the recess, and the acoustic transducer be disposed face down so that a connection terminal of the acoustic transducer faces the internal terminal portion.

This structure allows the acoustic transducer to be easily disposed compared to a case where the internal terminal portion of the terminal member of the first member extends along the side surface of the recess of the first member. In addition, the electrical connection between the acoustic transducer and the internal terminal portion of the terminal member of the first member is reliable.

It is preferable that the second member have (a) a first opening communicating with the external space, the first opening being provided in the main surface of the second member farther from the first member, (b) a second opening communicating with the internal space, the second opening being provided in the main surface of the second member closer to the first member, and (c) an acoustic path communicating between the first and second openings, the acoustic path being provided inside the second member, and (d) the first and second openings be distant from each other when viewed in a direction normal to the main surfaces of the second member.

In this case, the opening of the acoustic path communicating with the outside can be provided in the main surface of the second member farther from the first member, that is, the top surface of the acoustic transducer unit. Because the acoustic path communicating between the first and second openings is bent, it can prevent foreign matter from entering the internal space from the outside.

It is preferable that the first member have (a) a first opening communicating with the external space, the first opening being provided in an outer surface of the first member other than the surface to be bonded to the second member, (b) a second opening provided in the surface to be bonded to the second member, and (c) a first acoustic path communicating between the first and second openings, the first acoustic path being provided inside the first member. It is preferable that the second member have (i) a third opening provided in the surface to be bonded to the first member so as to face the second opening, (ii) a fourth opening communicating with the internal space, the fourth opening being provided in the main surface of the second member closer to the first member, and (iii) a second acoustic path communicating between the third and fourth openings, the second acoustic path being provided inside the second member.

In this case, the acoustic path opening communicating with the outside can be provided in a surface of the first member other than the surface abutted against the second member, that is, in the side surface or bottom surface of the acoustic transducer unit. Because the first and second acoustic paths are bent as a whole, they can prevent foreign matter from entering the internal space from the outside.

It is preferable that the internal terminal portion project from the bottom surface of the recess, a portion of the internal terminal portion have elasticity, the portion be elastically urged toward the second member, and the portion and the second member press and support the acoustic transducer.

In this case, variation in component sizes, such as the height of the acoustic transducer, the depth of the recess in the first member, and the height by which the internal terminal portion of the terminal member of the first member projects can be absorbed. Moreover, because the acoustic transducer is urged and pressed against the second member, the sealing properties are improved. Thus, deterioration in sensitivity characteristics due to sound leakage can be eliminated.

It is preferable that the acoustic transducer unit further include a mesh area having a plurality of through-holes.

In this case, the mesh area prevents foreign matter from entering the internal space from the external space, preventing the acoustic transducer from being adversely affected by the foreign matter.

It is preferable that the mesh area be disposed so as to transverse the acoustic path and have a mesh member.

In this case, it is possible to prevent foreign matter from entering the internal space through the acoustic path.

It is preferable that the acoustic path constitute the mesh area.

In this case, the acoustic path itself constitutes the mesh area, and it is possible to prevent foreign matter from entering the internal space through the acoustic path.

It is preferable that the body be formed of resin.

In this case, the first member can be molded as a single part by insert molding.

It is preferable that the terminal member be formed of metal.

In this case, the first member can be molded as a single part by insert molding.

It is preferable that the electromagnetic-shielding member be formed of metal.

In this case, the first member can be molded as a single part by insert molding.

The acoustic transducer unit according to the embodiment of the present invention can be easily reduced in size and height and can be manufactured at low cost.

Other features, elements, characteristics and advantages of the present invention will become more apparent from the following detailed description of preferred embodiments of the present invention with reference to the attached drawings.

DESCRIPTION OF THE PREFERRED EMBODIMENTS

Referring to FIGS. 1 to 15, an embodiment of the present invention will be described.
Embodiment
Referring to FIGS. 1 to 14B, an acoustic transducer unit 10 according to an embodiment will be described.

Figure 1:
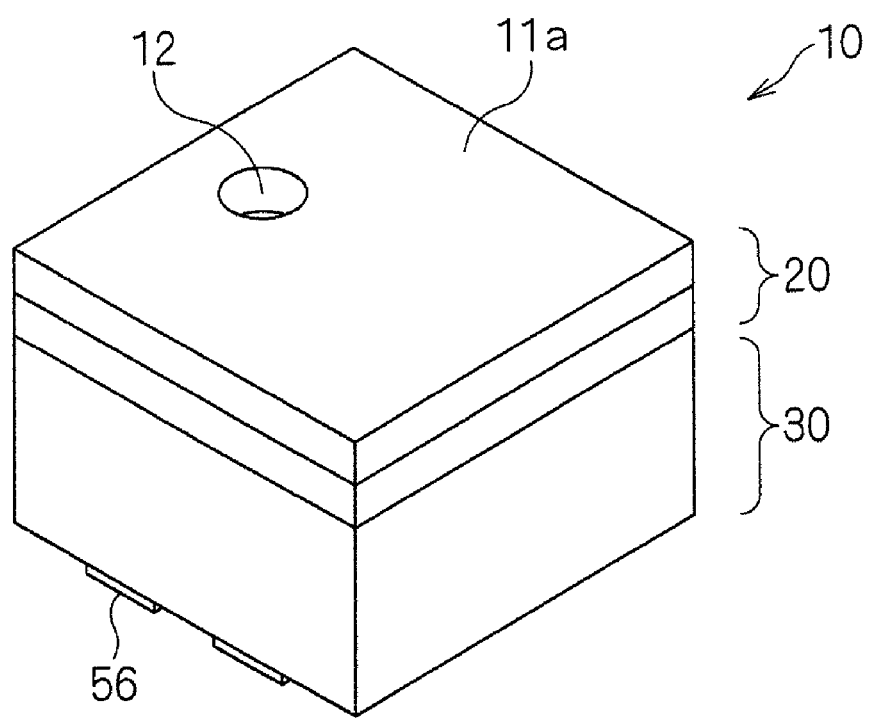
FIG. 1 is a perspective view of an acoustic transducer unit according to an embodiment of the present invention.
Figure 2:
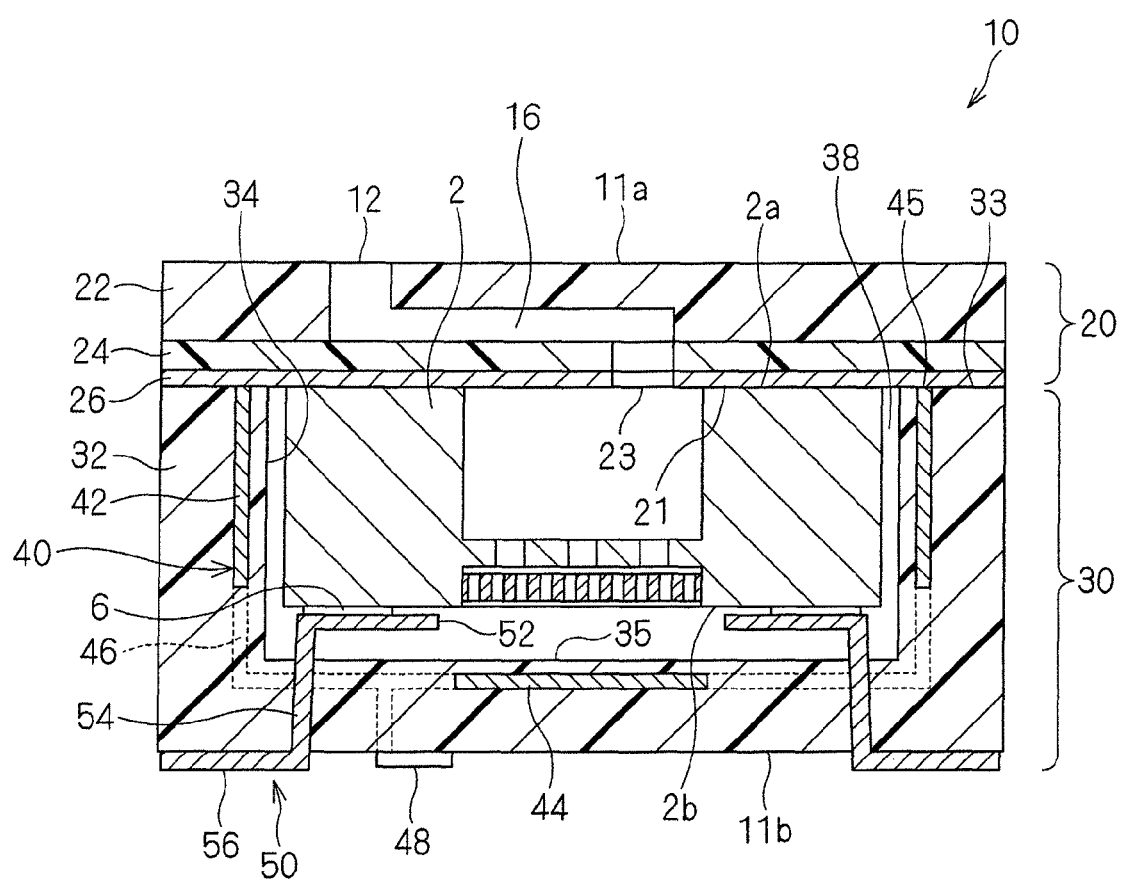
FIG. 2 is a sectional view of the acoustic transducer unit according to the embodiment.
Figure 3A:
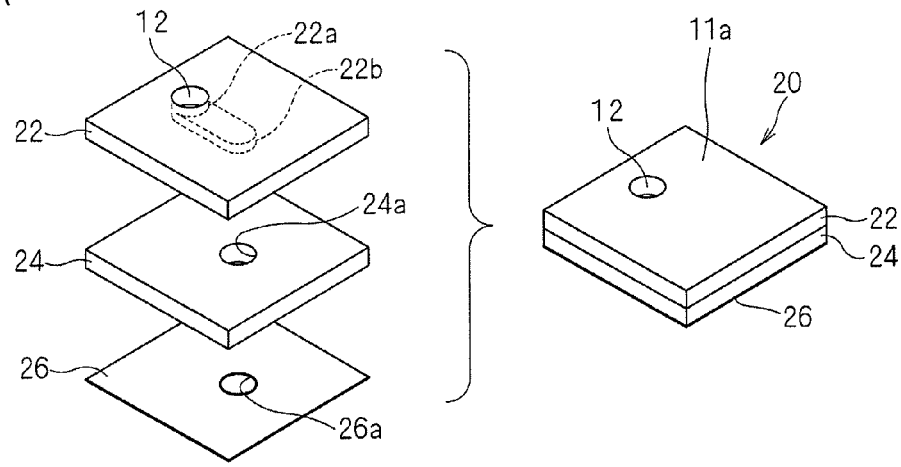
FIGS. 3A to 3C are exploded perspective views of the acoustic transducer unit according to the embodiment.
Figure 3B:
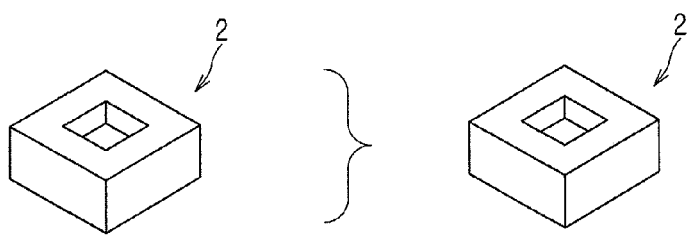
Figure 3C:
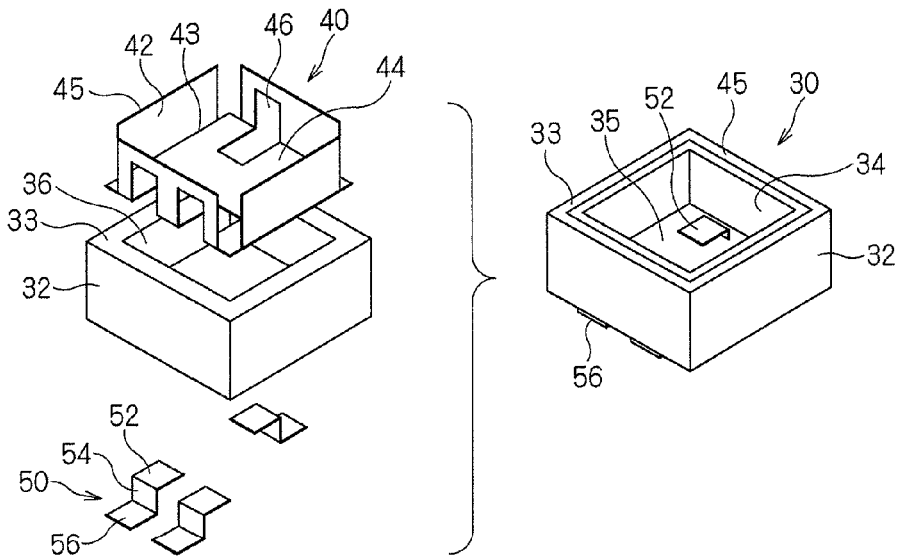
Figure 4A:
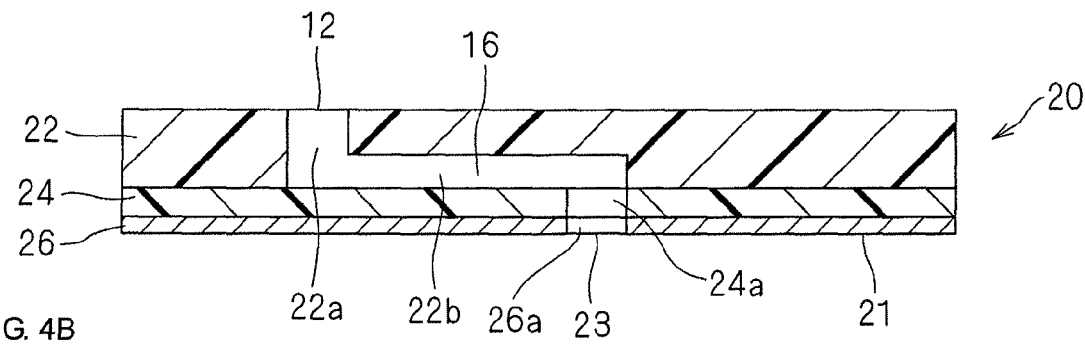
FIGS. 4A to 4C are exploded sectional views of the acoustic transducer unit according to the embodiment.
Figure 4B:
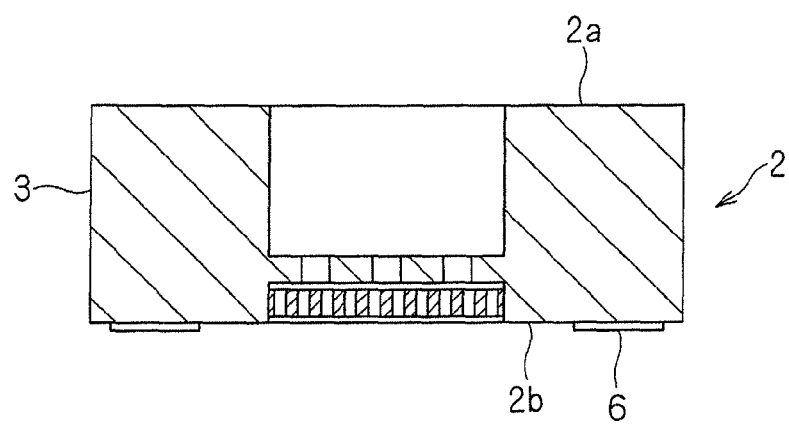
Figure 4C:
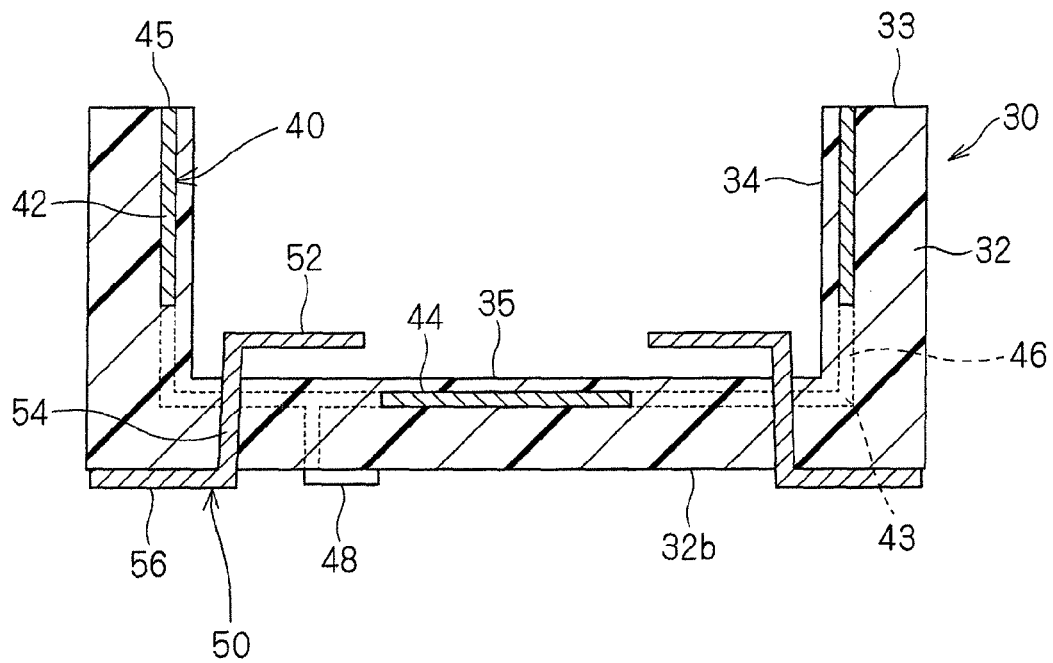

FIG. 1 is a perspective view showing the appearance of the acoustic transducer unit 10. FIG. 2 is a sectional view of the acoustic transducer unit 10. FIGS. 3A to 3C are exploded perspective views of the acoustic transducer unit 10. FIGS. 4A to 4C are exploded sectional views of the acoustic transducer unit 10.

As shown in FIGS. 1 to 4C, in the acoustic transducer unit 10, a housing including a first member 30 and a second member 20 accommodates a microphone element 2, which is an acoustic transducer. The microphone element 2 is a module component that includes, for example, a sensor portion and a peripheral circuit. Instead of the microphone element 2, another acoustic transducer element, such as a speaker element, may be accommodated.

The first member 30 has a recess 34. The second member 20 is connected to the first member 30 so as to cover the recess 34 in the first member 30. The microphone element 2 is accommodated in an internal space 38 defined by the second member 20 and the recess 34 in the first member 30 and is mounted on a bottom surface 35 of the recess 34 in the first member 30.

The first member 30 includes a body 32 made of resin and an electromagnetic-shielding member 40 and terminal members 50 made of metal, which are formed as a single part by, for example, an insert molding method. That is, as shown in FIGS. 3C and 4C, the first member 30 has the conductive electromagnetic-shielding member 40 inside the resin body 32 having the recess 34. Furthermore, the terminal members 50 penetrate through the body 32 so as to extend between the internal space 38 and the external space outside the housing.

The electromagnetic-shielding member 40 includes a substantially rectangular bottom surface portion 44 and side surface portions 42 that are bent perpendicularly along edges 43 of the bottom surface portion 44. The electromagnetic-shielding member 40 has openings 46 so as not to interfere with the terminal members 50.

The terminal members 50 each include an internal terminal portion 52 extending in the internal space 38 inside the housing, an external terminal portion 56 extending in the external space outside the housing, and a connecting portion 54 connecting the internal terminal portion 52 and the external terminal portion 56.

As shown in FIG. 2, the internal terminal portions 52 are connected to connection terminals 6 of the microphone element 2. Examples of the usable connecting method include Au bump, solder bump, conductive paste, and nano paste.

When the acoustic transducer unit 10 is mounted on an external circuit (not shown), the external terminal portions 56 are electrically connected to the external circuit.

The terminal members 50 are formed by bending plastic sheet materials. Portions projecting from the bottom surface 35 of the recess 34 in the body 32 have elasticity.

It is preferable that a top surface 2a of the microphone element 2 be higher than a top surface 33 of the body 32 of the first member 30 when the connection terminals 6 of the microphone element 2 are connected to the internal terminal portions 52 of the terminal members 50 because the component sizes, such as the height of the microphone element 2, the depth of the recess 34, and the height by which the internal terminal portions 52 of the terminal members 50 project, vary.

In this structure, as shown in FIG. 2, when the second member 20 is bonded to the top surface 33 of the body 32 of the first member 30, the microphone element 2 is elastically urged toward the second member 20 by elastic deformation of the portions of the terminal members 50 at the internal terminal portions 52 projecting from the bottom surface 35 of the recess 34 in the body 32. Thus, the top surface 2a of the microphone element 2 is pressed against the bottom surface 21 of the second member 20. This improves the sealing properties and eliminates deterioration in sensitivity characteristics due to sound leakage. In addition, variation in component sizes can be absorbed.

As shown in FIGS. 3A and 4A, the second member 20 includes, from above, a first sheet layer 22, a second sheet layer 24, and an electromagnetic shield layer 26 that are stacked together. The first sheet layer 22 has a through-hole 22a and a non-penetrating groove 22b. The non-penetrating groove 22b is formed in the bottom surface of the first sheet layer 22 facing the second sheet layer 24 and communicates with the through-hole 22a at one end. The second sheet layer 24 has a through-hole 24a communicating with the other end of the non-penetrating groove 22b in the first sheet layer 22. The electromagnetic shield layer 26 is formed of plate or metal foil and has a through-hole 26a communicating with the through-hole 24a in the second sheet layer 24.

As shown in FIG. 2, the through-hole 22a in the first sheet layer 22 provides an opening 12 in a top surface 11a of the acoustic transducer unit 10, and the through-hole 26a in the electromagnetic shield layer 26 provides an opening 23 in the bottom surface 21 of the second member 20. These openings 12 and 23 communicate with each other, forming an acoustic path 16 having a substantially S-shaped cross section.

Instead of providing one through-hole 26a in the electromagnetic shield layer 26, it is possible to provide a plurality of through-holes at the portion of the through-hole 26a. In this case, the plurality of through-holes provides a mesh structure, preventing foreign matter from entering the internal space 38 from the outside.

The entrance of foreign matter can also be prevented by providing a mesh member, which includes a mesh area having a plurality of through-holes, separately from the electromagnetic shield layer 26, and by disposing the mesh member inside the second member or on the top or bottom surface thereof in such a manner that the mesh area transverses the acoustic path communicating between the external space and the internal space. In this case, the entrance of foreign matter can be prevented without bending the acoustic path.

For example, it is possible that a straight through-hole serving as an acoustic path is formed in the second member, and the through-hole is filled with a sponge-like member serving as the mesh member. Alternatively, a netted member or a metal sheet having a plurality of through-holes, serving as the mesh member, may be disposed inside the second member or on the top or bottom surface thereof.

Alternatively, the mesh area may be formed of a plurality of acoustic paths. In this case, the mesh area can be formed without using a separate member.

The first member 30 and the second member 20 are bonded with a conductive adhesive. Upper edges 45 of the electromagnetic-shielding member 40, which are exposed at the top surface 33 of the first member 30, are electrically connected to the electromagnetic shield layer 26 formed at the bottom surface 21 of the second member 20.

As has been described above, in the acoustic transducer unit 10, the microphone element 2 is mounted face down inside the housing. Therefore, no wiring space is needed, whereby the size and height of the acoustic transducer unit 10 can be reduced. Furthermore, the volume around (e.g., above and below) the microphone element 2 in the internal space 38 can be freely determined. Thus, an acoustically optimum design can be achieved by eliminating unnecessary volume.

By fabricating the first member 30 by insert molding, electrode formation processing, such as plating, becomes unnecessary. The second member 20 may be formed of a plate member provided with electrodes or a plate member formed by laminating metal foil. Thus, a reasonable structure can be realized.

Furthermore, because the second member 20 is planar, the acoustic path can be formed by boring, grooving, and bonding the plates. Thus, a complex technique, such as a technique for forming a path in a multilayer substrate, is unnecessary. Furthermore, it is easy to form an acoustic path with high form accuracy.

Referring to FIGS. 5A to 14B, a method for manufacturing the acoustic transducer unit 10 will be described.

First, the first member 30 and the second member 20 are fabricated.

Figure 5A:
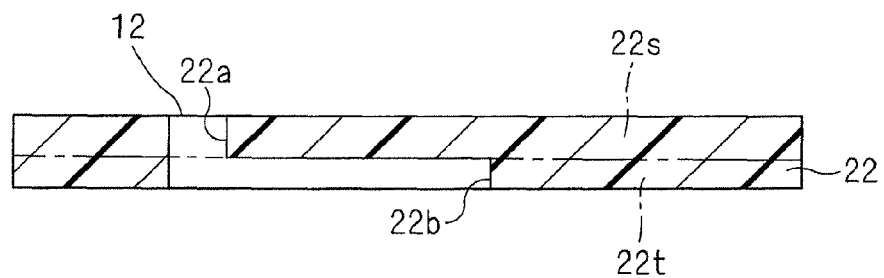
FIGS. 5A and 5B are exploded sectional views of a cap member according to the embodiment.

To produce the second member 20, as shown in a sectional view in FIG. 5A, the first sheet layer 22 having the through-hole 22a and the non-penetrating groove 22b is fabricated. The first sheet layer 22 may be formed either by boring and grooving the plate or by dividing the first sheet layer 22 into an upper part 22s and a lower part 22t, as shown by a dot and dash line, forming through-holes in these plates, and bonding them together.

Figure 5B:
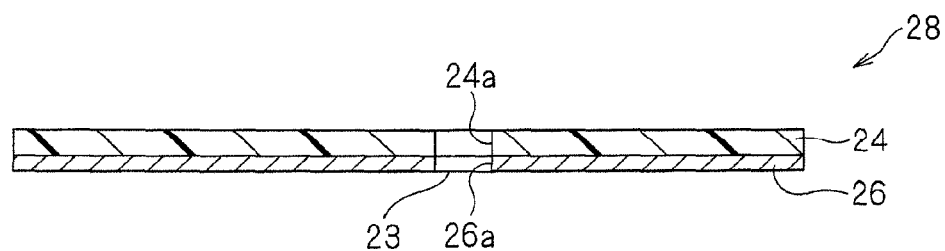

In addition, as shown in a sectional view in FIG. 5B, a laminated body 28 is fabricated by forming the electromagnetic shield layer 26 on one surface of the second sheet layer 24 by plating or the like and providing the through-holes 24a and 26a in the second sheet layer 24 and the electromagnetic shield layer 26.

Then, the first sheet layer 22 shown in FIG. 5A and the laminated body 28 shown win FIG. 5B are bonded together.

To produce the first member 30, first, a sheet member 40s for the electromagnetic-shielding member 40 and a sheet member 50s for the terminal members 50 are formed from metal foil.

The sheet member 40s for the electromagnetic-shielding member 40 is formed through a process shown in FIGS. 6A to 8.

Figure 6A:
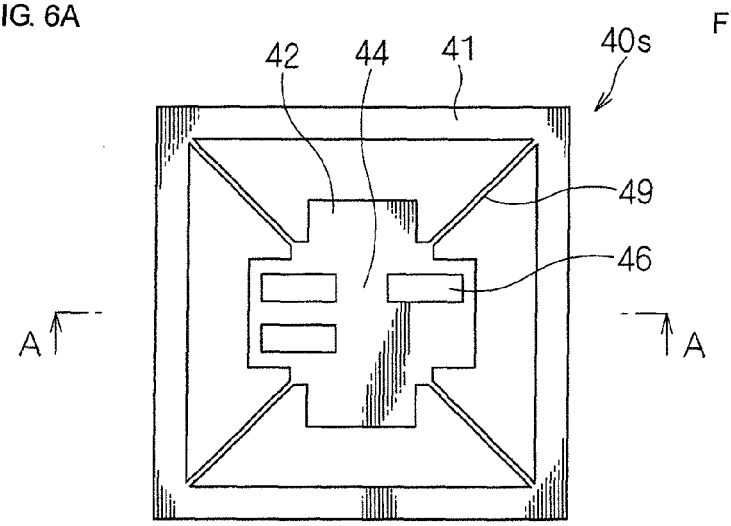
FIGS. 6A and 6B are a plan view and a sectional view of a relevant part, respectively, showing the manufacturing process according to the embodiment.
Figure 6B:

That is, as shown in a plan view in FIG. 6A, the sheet member 40s, in which portions constituting the bottom surface portion 44 and the side surface portions 42 of the electromagnetic-shielding member 40 are connected to a frame 41 via supporting portions 49, is formed by stamping metal foil. The portions constituting the bottom surface portion 44 and the side surface portions 42 of the electromagnetic-shielding member 40 have openings 46. As shown in FIG. 6B, which is a sectional view of a relevant part taken along line A-A in FIG. 6A, the portions constituting the bottom surface portion 44 and the side surface portions 42 of the electromagnetic-shielding member 40 are in the same plane.

Figure 7A:
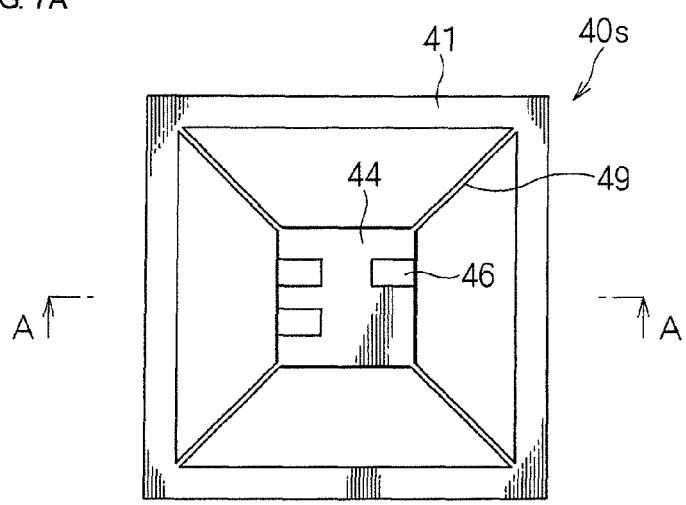
FIGS. 7A and 7B are a plan view and a sectional view of a relevant part, respectively, showing the manufacturing process according to the embodiment.
Figure 7B:
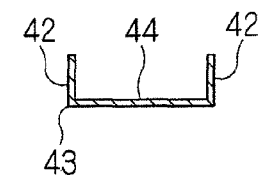
Figure 8:
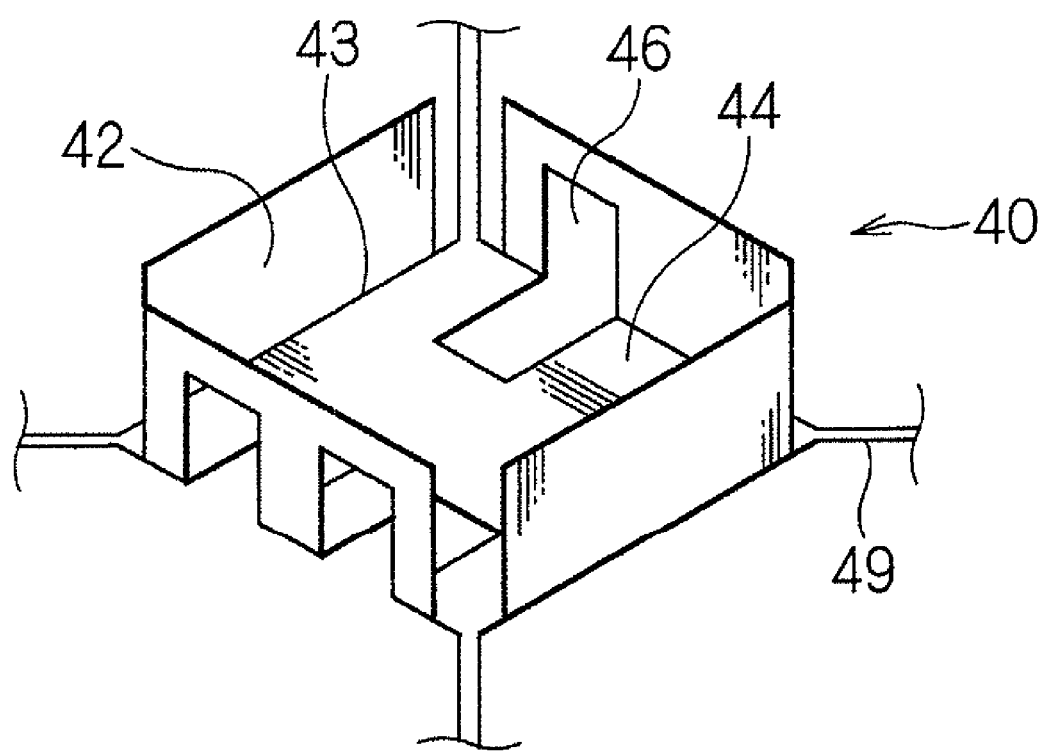
FIG. 8 is a perspective view of a relevant part, showing the manufacturing process according to the embodiment.

Then, as shown in a plan view in FIG. 7A, FIG. 7B (which is a sectional view of a relevant part taken along line A-A in FIG. 7A), and a perspective view of a relevant part in FIG. 8, the portions constituting the side surface portions 42 of the electromagnetic-shielding member 40 are bent perpendicularly along the edges 43 of the bottom surface portion 44 of the electromagnetic-shielding member 40.

On the other hand, a sheet member 50s for the terminal members 50 is formed through a process shown in FIGS. 9A to 10B.

Figure 9A:
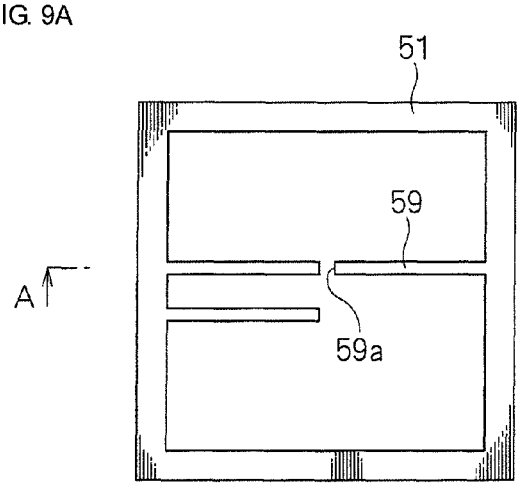
FIGS. 9A and 9B are a plan view and a sectional view of a relevant part, respectively, showing the manufacturing process according to the embodiment.
Figure 9B:
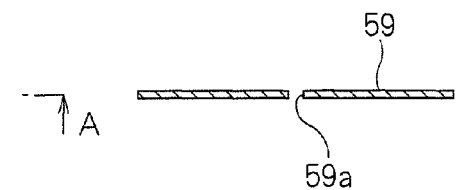

That is, as shown in a plan view in FIG. 9A, the sheet member 50s, in which portions 59 constituting three terminal members 50 are connected to a frame 51 at base ends, is formed by stamping metal foil. As shown in FIG. 9B, which is a sectional view of a relevant part taken along line A-A in FIG. 9A, the portions 59 constituting the terminal members 50 are in the same plane.

Figure 10A:
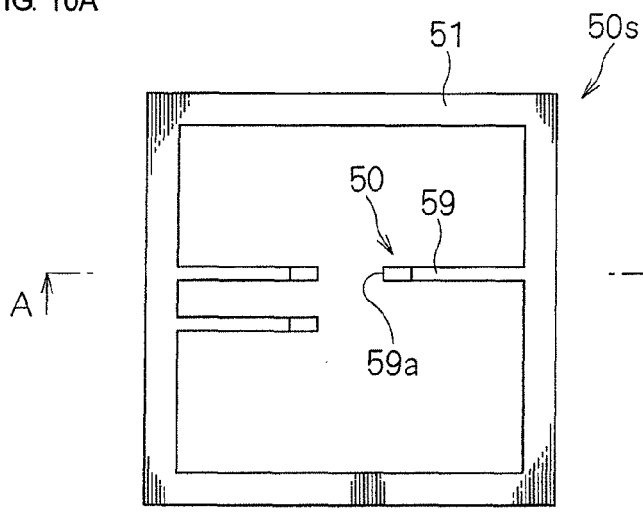
FIGS. 10A and 10B are a plan view and a sectional view of a relevant part, respectively, showing the manufacturing process according to the embodiment.
Figure 10B:
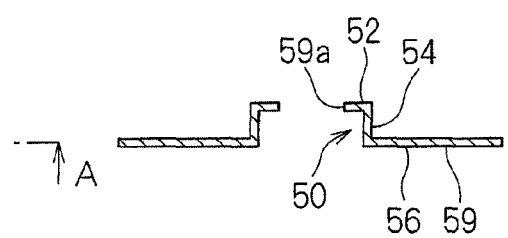

Then, as shown in a plan view in FIG. 10A and FIG. 10B, which is a sectional view of a relevant part taken along line A-A in FIG. 10A, tips 59a of the portions 59 constituting the terminal members 50 are bent. That is, portions constituting the connecting portions 54 are bent perpendicularly to portions constituting the external terminal portions 56 of the terminal members 50, and portions constituting the internal terminal portions 52 are bent perpendicularly to the portions constituting the connecting portions 54.

Then, using the sheet member 40s for the electromagnetic-shielding member 40 and the sheet member 50s for the terminal members 50, insert molding is performed.

Figure 11A:
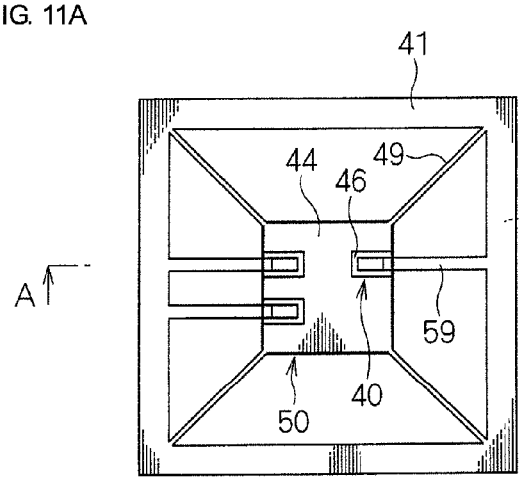
FIGS. 11A and 11B are a plan view and a sectional view of a relevant part, respectively, showing the manufacturing process according to the embodiment.
Figure 11B:
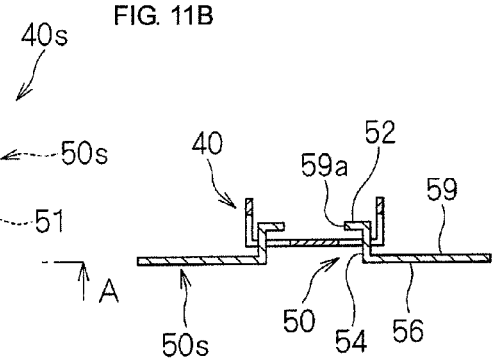

That is, as shown in a plan view in FIG. 11A and FIG. 11B, which is a sectional view of a relevant part taken along line A-A in FIG. 11A, the sheet member 40s for the electromagnetic-shielding member 40 is placed on the sheet member 50s for the terminal members 50 with a predetermined distance therebetween.

Figure 12A:
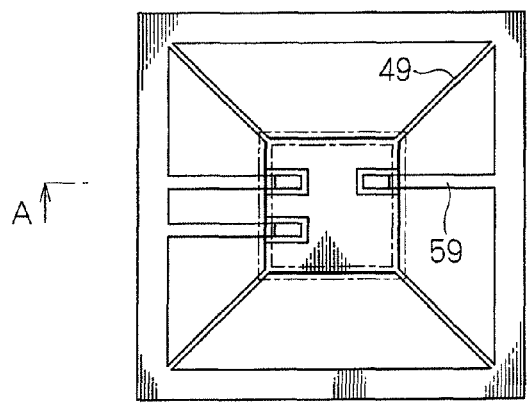
FIGS. 12A and 12B are a plan view and a sectional view of a relevant part, respectively, showing the manufacturing process according to the embodiment.
Figure 12B:
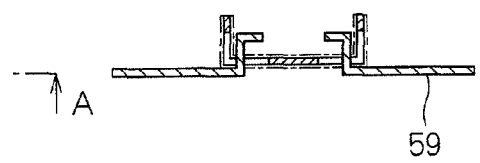

Then, as shown in a plan view in FIG. 12A and FIG. 12B, which is a sectional view of a relevant part taken along line A-A in FIG. 12A, the sheet member 50s for the terminal members 50 and the sheet member 40s for the electromagnetic-shielding member 40 are put in a mold. A dot and dash line indicates a space defined by the mold.

Figures 13A, 13B:
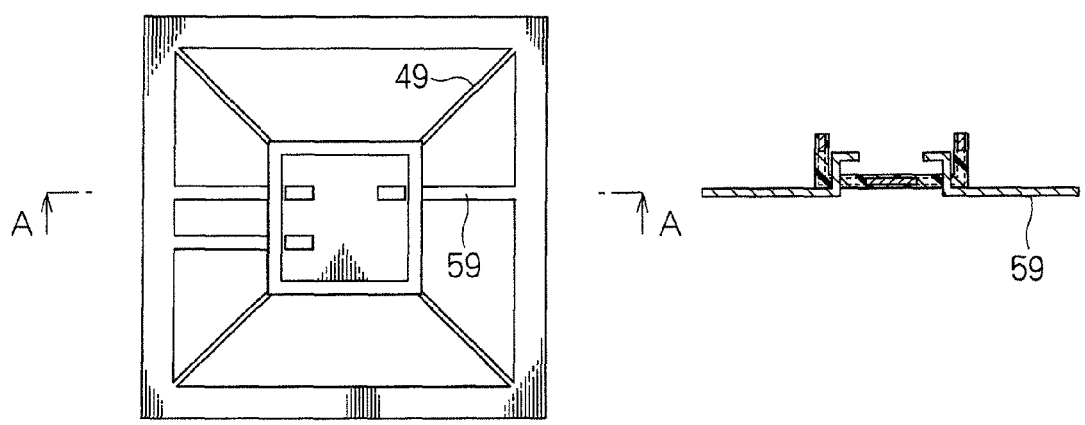
FIGS. 13A and 13B are a plan view and a sectional view of a relevant part, respectively, showing the manufacturing process according to the embodiment.

Then, as shown in a plan view in FIG. 13A and FIG. 13B, which is a sectional view of a relevant part taken along line A-A in FIG. 13A, resin is injected into the space defined by the mold to form the body 32.

Figure 14A:
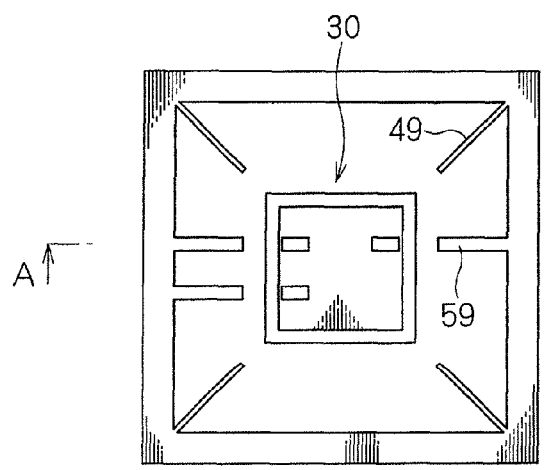
FIGS. 14A and 14B are a plan view and a sectional view of a relevant part, respectively, showing the manufacturing process according to the embodiment.
Figure 14B:
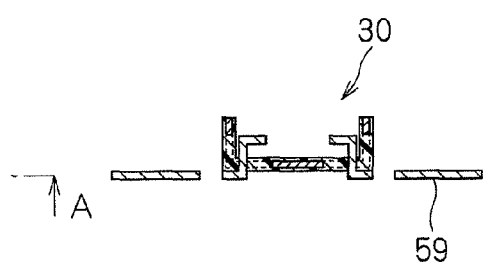

Then, as shown in a plan view in FIG. 14A and FIG. 14B, which is a sectional view of a relevant part taken along line A-A in FIG. 14A, the sheet members 40s and 50s and the resin are cut to remove unwanted portions. Thus, a portion constituting the first member 30 is separated.

Once the first member 30 and the second member 20 are fabricated, they are assembled.

That is, the microphone element 2 is mounted on the recess 34 of the first member 30. At this time, by adequately selecting the size of the gaps between the side surfaces 36 of the recess 34 and the microphone element 2, the microphone element 2 can be accurately positioned along the side surfaces 36 of the recess 34.

After the microphone element 2 is mounted, the second member 20 is bonded to the top surface 33 of the first member 30 with a conductive adhesive. Thus, the acoustic transducer unit 10 is completed.

Alternatively, it is possible that the microphone element 2 is fixed to the bottom surface 21 of the second member 20 to form an integrated part of the second member 20 and the microphone element 2, and the microphone element 2 of the integrated part is inserted into the recess 34 in the first member 30. Then, the first member 30 and the second member 20 are bonded.

By using the first member 30 fabricated by insert molding, as described above, the acoustic transducer unit 10 can be manufactured at lower cost than the case where a multilayer substrate is used.

Modifications

Figure 15A:
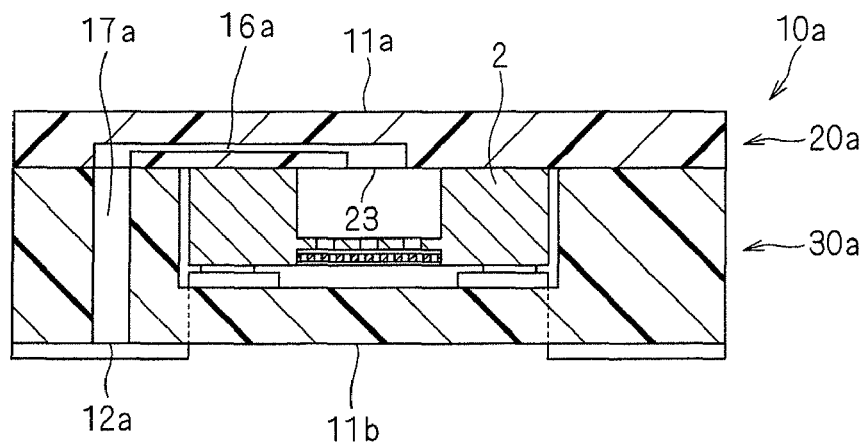
FIGS. 15A, 15B, and 15C are sectional views of acoustic transducer units according to modifications.
Figure 15B:
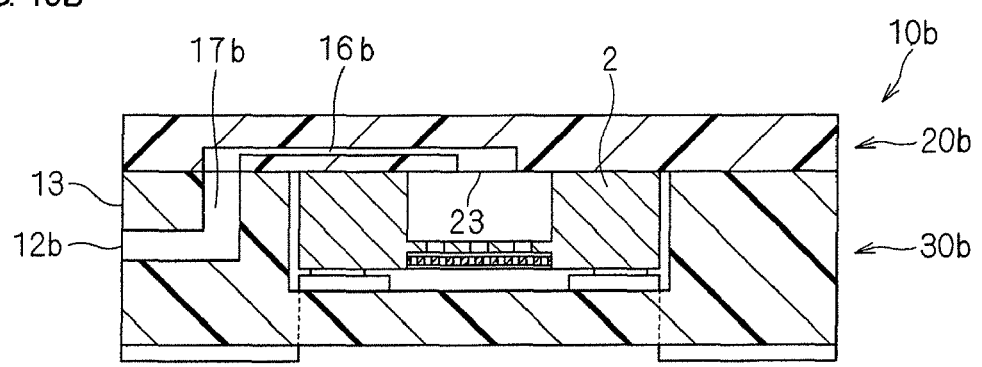
Figure 15C:
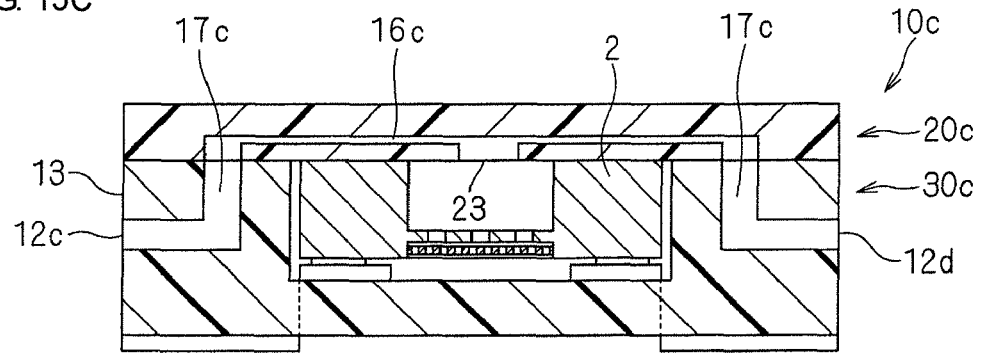
Figure 16:
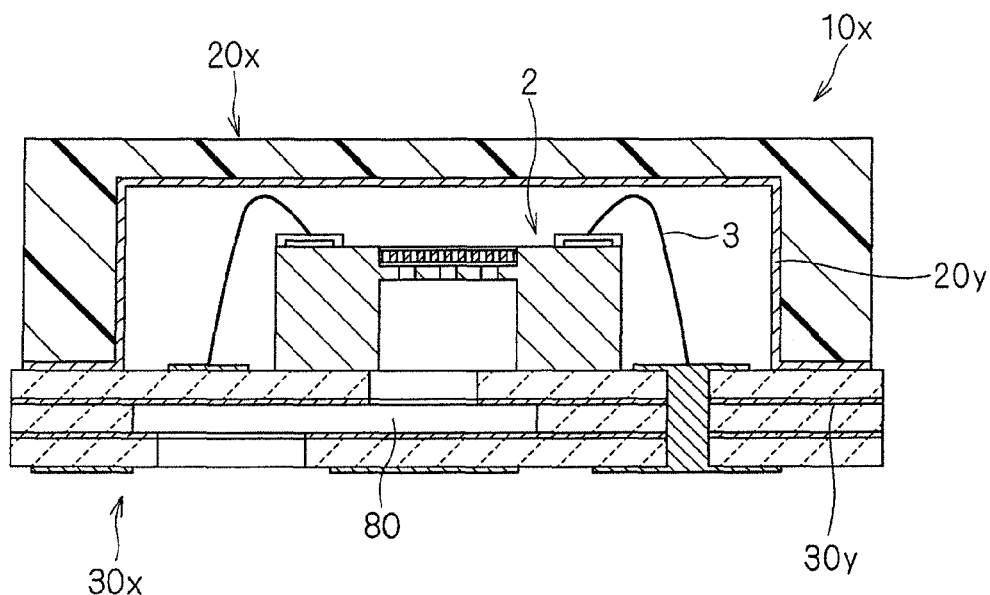
FIG. 16 is a sectional view of an acoustic transducer unit according to a comparative example.
Figure 17:
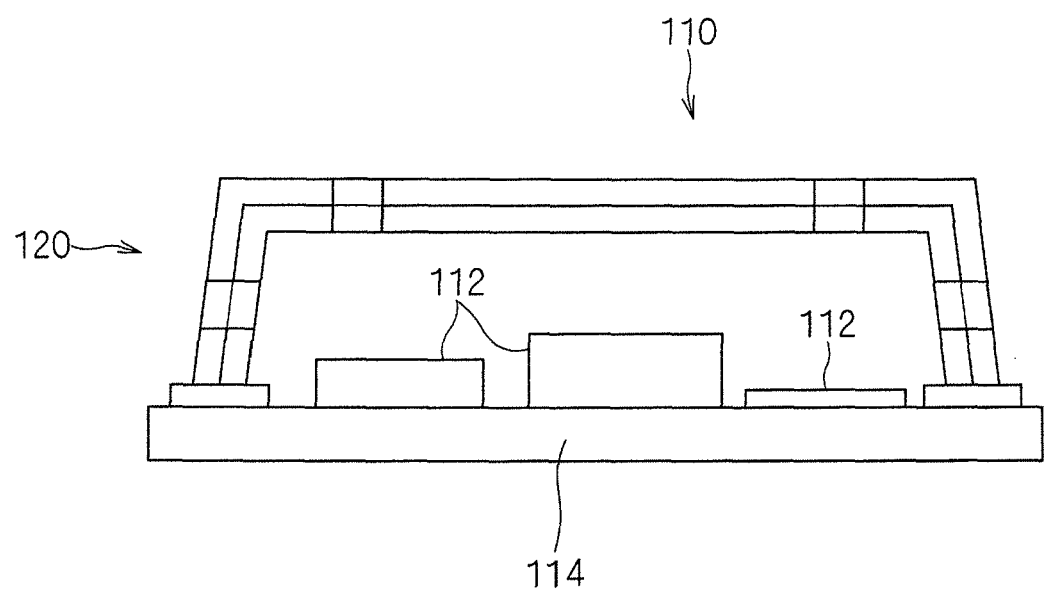
FIG. 17 is a sectional view of a conventional acoustic transducer unit.

Referring to FIGS. 15A to 15C, acoustic transducer units 10a to 10c according to modifications will be described. The acoustic transducer units 10a to 10c according to the modifications differ from the acoustic transducer unit 10 according to the above-described embodiment in the structures of acoustic paths 16a and 17a, 16b and 17b, and 16c and 17c, respectively.

That is, the acoustic transducer unit 10a shown in a sectional view in FIG. 15A has an opening 12a in a bottom surface 11b of the acoustic transducer unit 10a. The opening 12a communicates with the opening 23 at the microphone element 2 via a first acoustic path 17a, which is a through-hole formed in a first member 30a, and a second acoustic path 16a, which is a through-hole formed in a second member 20a.

The acoustic transducer unit 10b shown in a sectional view in FIG. 15B has an opening 12b in a side surface 13 of the acoustic transducer unit 10b. The opening 12b communicates with the opening 23 at the microphone element 2 via a first acoustic path 17b, which is a through-hole formed in a first member 30b, and a second acoustic path 16b, which is a through-hole formed in a second member 20b.

The acoustic transducer unit 10c shown in a sectional view in FIG. 15C has a plurality of openings 12c in the side surfaces 13 of the acoustic transducer unit 10c. The openings 12c communicate with the opening 23 at the microphone element 2 via first acoustic paths 17c, which are through-holes formed in a first member 30c, and a second acoustic path 16c, which is a through-hole formed in a second member 20c. The first and second acoustic paths 17c and 16c are branched.

The first members 30a, 30b, and 30c shown in FIGS. 15A, 15B, and 15C, respectively, may be fabricated by insert molding as in the above-described embodiment, whereby the first acoustic paths 17a, 17b, and 17c having high form accuracy can be formed. The second members 20a, 20b, and 20c shown in FIGS. 15A, 15B, and 15C, respectively, may be formed by boring, grooving, and bonding the plates as in the above-described embodiment. Thus, the acoustic paths having high form accuracy can be easily formed.

In conclusion, as has been described above, it is easy to reduce the size and height of the acoustic transducer units 10, 10a, 10b, and 10c, in which the first member 30 embedded with the electromagnetic-shielding member 40 and the terminal members 50 by, for example, insert molding, accommodates the microphone element 2 in the recess 34 in the body 32 and is covered with the second member 20. In addition, such acoustic transducer units 10, 10*a*, 10*b*, and 10*c* can be manufactured at low cost.

The present invention is not limited to the above-described embodiment and may be embodied in variously modified forms.

For example, the top surface or the bottom surface of the acoustic transducer unit may have a plurality of openings communicating with the internal space.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An acoustic transducer unit comprising:
a first member having a body defining a recess;
a second member covering the recess of the first member to form a housing;
an acoustic transducer accommodated in an internal space of the housing;
an acoustic path communicating between the internal space and an external space of the housing;
an electromagnetic-shielding member embedded within a wall of the body and having conductivity; and
a terminal member having an internal terminal portion that extends in the internal space of the housing and is electrically connected to the acoustic transducer, an external terminal portion that extends to the external space, and a connecting portion connecting the internal terminal portion and the external terminal portion,
wherein the second member has conductivity and is electrically connected to the electromagnetic-shielding member,
wherein the second member has:
a first opening communicating with the external space, the first opening being provided in a first surface of the second member distal from the first member;
a second opening communicating with the internal space, the second opening being provided in a second surface of the second member proximal to the first member; and
an acoustic path communicating between the first and second openings, the acoustic path being provided inside the second member, and
wherein the first and second openings are distant from each other when viewed in a direction normal to the first and second surfaces of the second member.

2. The acoustic transducer unit according to claim 1, wherein the internal terminal portion extends along a bottom surface of the recess, and
wherein the acoustic transducer is disposed face down so that a connection terminal of the acoustic transducer faces the internal terminal portion.

3. An acoustic transducer unit comprising:
a first member having a body defining a recess;
a second member covering the recess of the first member to form a housing;
an acoustic transducer accommodated in an internal space of the housing;
an acoustic path communicating between the internal space and an external space of the housing;
an electromagnetic-shielding member disposed inside the body and having conductivity; and
a terminal member having an internal terminal portion that extends in the internal space of the housing and is electrically connected to the acoustic transducer, an external terminal portion that extends to the external space, and a connecting portion connecting the internal terminal portion and the external terminal portion,
wherein the second member has conductivity and is electrically connected to the electromagnetic-shielding member,
wherein the first member has:
a first opening communicating with the external space, the first opening being provided in an outer surface of the first member other than a surface thereof in contact with the second member,
a second opening provided in the surface contacting the second member, and
a first acoustic path communicating between the first and second openings, the first acoustic path being provided inside the first member, and
wherein the second member has:
a third opening provided in a first surface thereof in contact with the first member, the third opening facing the second opening,
a fourth opening communicating with the internal space, the fourth opening being provided in the first surface of the second member, and
a second acoustic path communicating between the third and fourth openings, the second acoustic path being provided inside the second member.

4. The acoustic transducer unit according to claim 3, wherein the first opening is provided in an bottom surface of the first member.

5. The acoustic transducer unit according to claim 3, wherein the first opening is provided in a side surface of the first member.

6. The acoustic transducer unit according to claim 3, wherein the first member further has:
a fifth opening communicating with the external space, the first opening being provided in an outer surface of the first member other than a surface thereof in contact with the second member,
a sixth opening provided in the surface contacting the second member, and
a third acoustic path communicating between the fifth and sixth openings, the third acoustic path being provided inside the first member, and
wherein the second member has:
a seventh opening provided in the first surface thereof in contact with the first member, the seventh opening facing the sixth opening, and
a fourth acoustic path communicating between the third and seventh openings, the fourth acoustic path being provided inside the second member.

7. The acoustic transducer unit according to claim 1, wherein the internal terminal portion projects from a bottom surface of the recess, a portion of the internal terminal portion has elasticity, the portion being elastically urged toward the second member, and the portion and the second member pressing and supporting the acoustic transducer.

8. The acoustic transducer unit according to claim 1, further comprising a mesh area having a plurality of through-holes.

9. The acoustic transducer unit according to claim 8, wherein the mesh area is disposed so as to transverse the acoustic path and has a mesh member.

10. The acoustic transducer unit according to claim 8, wherein the acoustic path constitutes the mesh area.

11. The acoustic transducer unit according to claim 1, wherein the body is formed of resin.

12. The acoustic transducer unit according to claim 1, wherein the terminal member is formed of metal.

13. The acoustic transducer unit according to claim 1, wherein the electromagnetic-shielding member is formed of metal.

* * * * *